United States Patent
Kux

(10) Patent No.: US 7,808,833 B2
(45) Date of Patent: Oct. 5, 2010

(54) METHOD OF OPERATING AN INTEGRATED CIRCUIT, INTEGRATED CIRCUIT AND METHOD TO DETERMINE AN OPERATING POINT

(75) Inventor: Andreas Kux, Haar (DE)

(73) Assignee: Qimonda Flash GmbH, Dresden (DE)

( * ) Notice: Subject to any disclaimer, the term of this patent is extended or adjusted under 35 U.S.C. 154(b) by 369 days.

(21) Appl. No.: 12/020,977

(22) Filed: Jan. 28, 2008

(65) Prior Publication Data
US 2009/0190408 A1 Jul. 30, 2009

(51) Int. Cl.
*G11C 16/04* (2006.01)

(52) U.S. Cl. .............................. 365/185.24; 365/189.07

(58) Field of Classification Search ............ 365/185.24, 365/189.07
See application file for complete search history.

(56) References Cited

U.S. PATENT DOCUMENTS

| | | | |
|---|---|---|---|
| 5,745,412 A | * | 4/1998 | Choi ....................... 365/185.1 |
| 5,867,429 A | | 2/1999 | Chen et al. |
| 5,905,674 A | * | 5/1999 | Choi ....................... 365/185.1 |
| 6,011,725 A | | 1/2000 | Eitan |
| 6,178,118 B1 | * | 1/2001 | Lin et al. ............... 365/185.28 |
| 6,522,580 B2 | | 2/2003 | Chen et al. |
| 6,807,095 B2 | | 10/2004 | Chen et al. |
| 7,046,553 B2 | | 5/2006 | Ogura et al. |
| 2001/0048614 A1 | | 12/2001 | Bloom et al. |
| 2002/0159293 A1 | | 10/2002 | Hamilton et al. |
| 2003/0021155 A1 | | 1/2003 | Yachareni et al. |
| 2004/0125653 A1 | | 7/2004 | Tran et al. |
| 2005/0276101 A1 | | 12/2005 | Chen et al. |
| 2008/0055979 A1 | * | 3/2008 | Shim ..................... 365/185.02 |
| 2009/0175076 A1 | * | 7/2009 | Cho et al. ............. 365/185.03 |

FOREIGN PATENT DOCUMENTS

EP  1 271 553 A2  1/2003

* cited by examiner

*Primary Examiner*—Tuan T. Nguyen
(74) *Attorney, Agent, or Firm*—Slater & Matsil, L.L.P.

(57) ABSTRACT

Embodiments of the present invention relate to a method to operate an integrated circuit that includes a memory. The memory encompasses a first and a second threshold level. The invention further relates to integrated circuits including a memory with a first and a second threshold level and a method to determine an operating point of an integrated circuit.

5 Claims, 8 Drawing Sheets

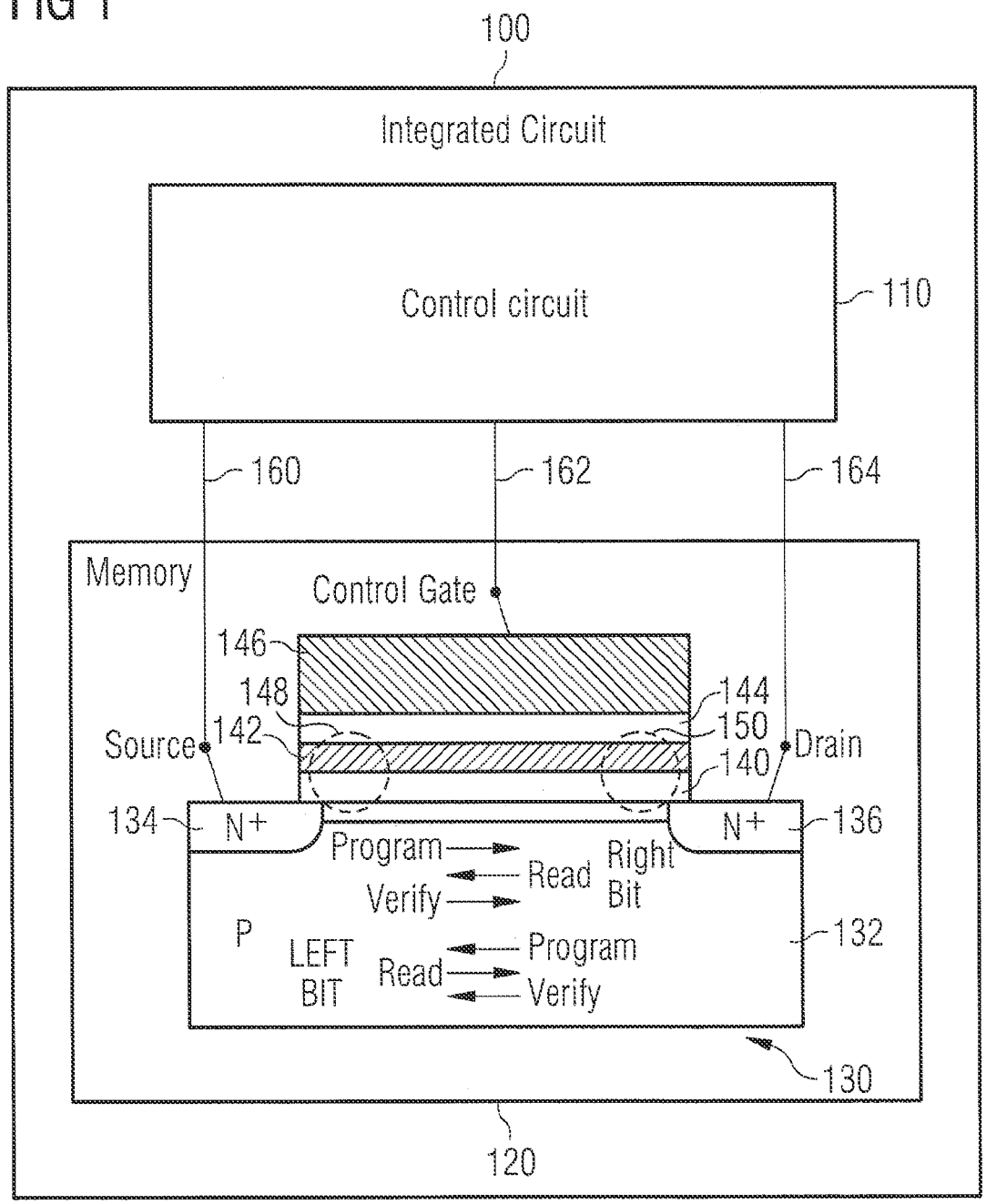

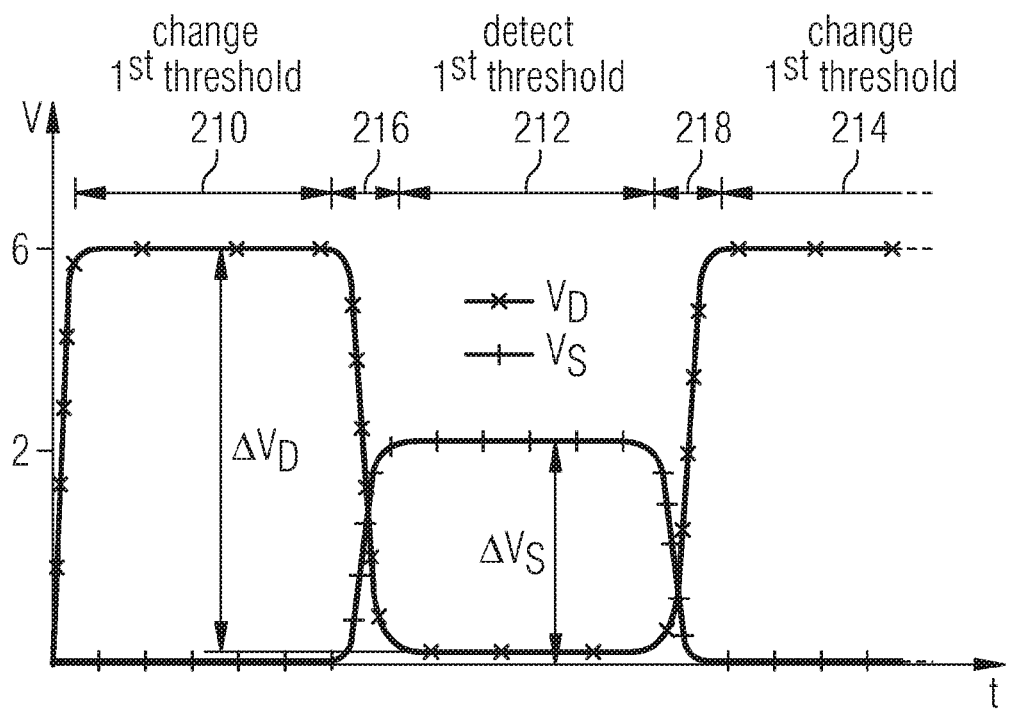
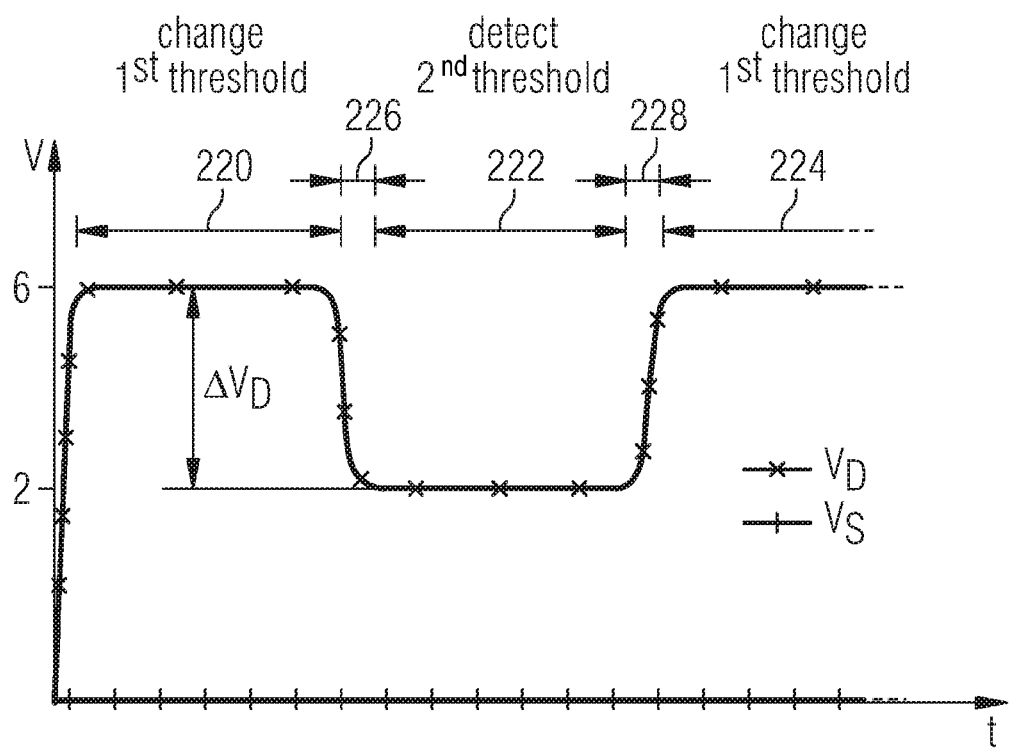

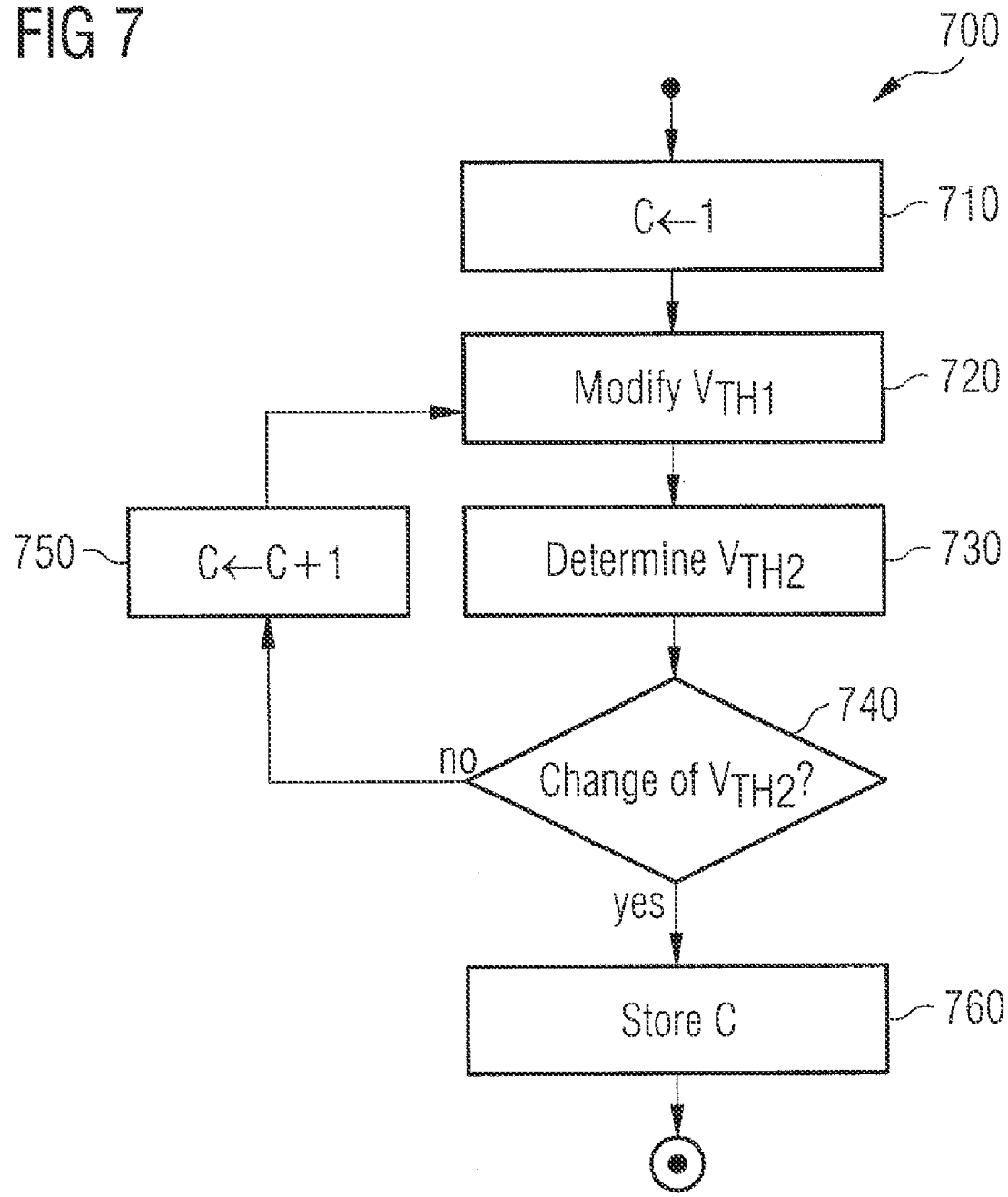

METHOD OF OPERATING AN INTEGRATED CIRCUIT, INTEGRATED CIRCUIT AND METHOD TO DETERMINE AN OPERATING POINT

BACKGROUND

Embodiments of the present invention relate to integrated circuits comprising a memory and methods for their operation. More particularly, the invention relates to integrated circuits comprising a memory, the memory comprising at least a first and a second threshold level.

BRIEF DESCRIPTION OF THE DRAWINGS

Various aspects of the present invention will be described using illustrative yet non-limiting embodiments as shown in the attached drawings. In particular:

FIG. 1 shows a block diagram of an integrated circuit according to one embodiment;

FIG. 2A shows a schematic diagram of voltages provided during a first sequence of operations;

FIG. 2B shows a schematic diagram of voltages provided during a second sequence of operations;

FIG. 7 shows a flow chart of an embodiment of a method to determine an operating point of an integrated circuit.

DETAILED DESCRIPTION OF ILLUSTRATIVE EMBODIMENTS

Figure 2C:
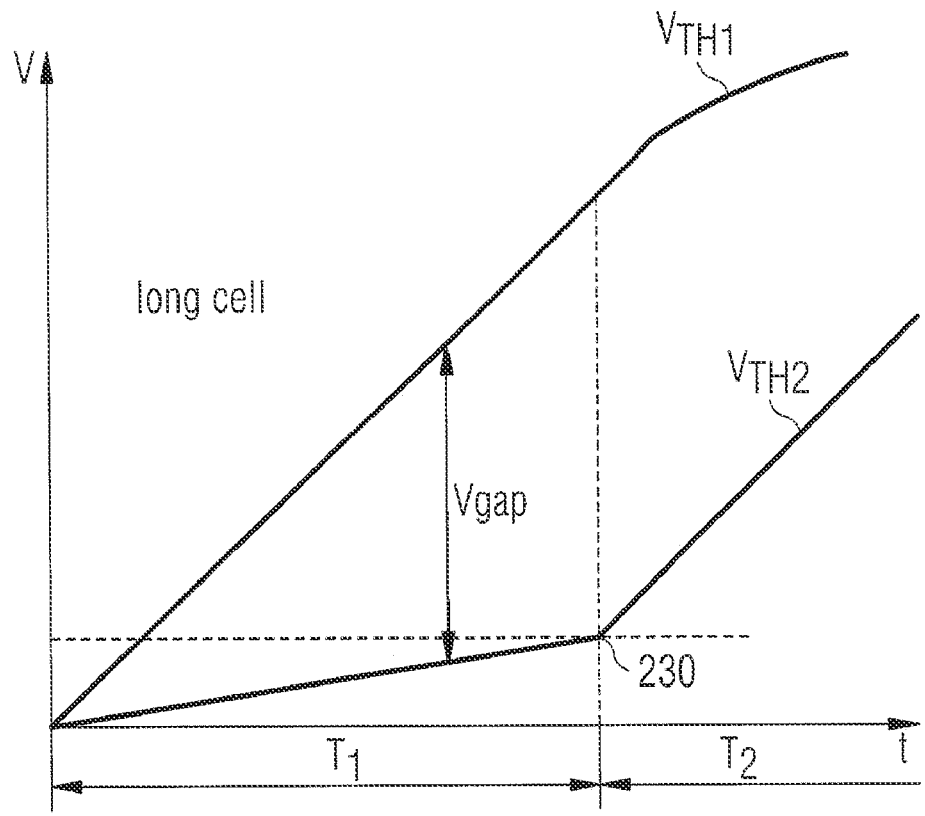
FIG. 2C shows a schematic diagram of a first threshold level and a second threshold level of a first memory cell.

FIG. 1 shows a schematic diagram of an integrated circuit 100. The integrated circuit 100 comprises a control circuit 110 and a memory 120. The control circuit 110 controls the memory 120 by means of at least three programming lines 160, 162 and 164. The control circuit 110 is adapted to control various aspects of the operation of the memory 120 by means of application of various voltages provided to the programming lines 160, 162 and 164.

The memory 120 comprises at least one memory cell 130. For example, the memory cell 130 may be a so-called nitride read-only memory cell (NROM), which is a kind of non-volatile memory cell. Alternatively, the memory cell 130 may be another type of volatile or non-volatile memory, e.g., an SONOS—(Semiconductor-Oxide-Nitride-Oxide-Semiconductor), FRAM—(Ferro-electric), MRAM—(Magneto-resistive RAM), PCM—(Phase Change Memory) or any other memory cell known from the art, whose programming state is determined by means of a threshold level.

In the embodiment shown in FIG. 1, only an example memory cell 130 is shown. However, other embodiments may comprise a plurality of memory cells and associated selection circuitry. In particular, the memory 120 may comprise thousand, millions or billion of memory cells arranged in a regular structure, each memory cell being accessible by a unique address.

In FIG. 1, the memory cell 130 comprises a P-type semiconductor substrate 132. The semiconductor substrate 132 comprises an N+-type source region 134 and an N+-type drain region 136. The source region 134 is embedded in a left part of the semiconductor substrate 132 as shown in FIG. 1, while the drain region 136 is embedded in a right part of the semiconductor substrate 132. The source region 134 and drain region 136 can be formed by doping the semiconductor substrate 132 with a suitable dopant in the left part and the right part, respectively.

If, as shown in FIG. 1, an identical dopant is employed in the source region 134 and the drain region 136, corresponding PN-junctions between the semiconductor substrate 132 and the source region 134 and the drain region 136, respectively, are formed in the memory cell 130.

It should be noted that by using identical concentration and type of dopants in the source region 134 and the drain region 136, a symmetrical structure is created in the semiconductor substrate 132. Consequently, the terms "SOURCE" and "DRAIN" shown in FIG. 1 can be assigned arbitrarily to the left part and the right part of the semiconductor substrate 132. Within the scope of this application these terms are solely used to better distinguish the regions 134 and 136. However, they are not meant to imply a particular direction of a current flowing through the memory cell 130. In general, other memory cells may include a symmetric or asymmetric structure, which need to be accessed in different ways depending on their specific structure.

The memory cell 130 shown in FIG. 1 further comprises a first insulation layer 140 formed on top of the semiconductor substrate 132. For example, the first insulation layer 140 may comprise an oxide layer such as silicon dioxide. On top of the first insulation layer 140, a charge trapping layer 142 is formed. The charge trapping layer 142 may comprise a nitride layer. On top of the charge trapping layer 142, a second insulation layer 144 is formed. The second insulation layer 144 may be similar to the first insulation layer 140. For example, the second insulation layer 144 may comprise an oxide layer such as silicon oxide. On top of the second insulation layer 144, a control gate 146 is formed. The control gate 146 may comprise a conductive layer. For example, a metal or polycrystalline layer may be formed on top of the second insulation layer 144.

In the embodiment shown in FIG. 1, the source region 134 is coupled to the control circuit 110 by means of the first programming line 160. The control gate 146 is coupled to the control circuit 110 by means of the second programming line 162. The drain region 136 is coupled to the control circuit 110 by means of the third programming line 164.

The control circuit 110 may be used to apply an electrical potential to the control gate 146 by means of the second programming line 162. For example, if a positive voltage potential is applied to the control gate 146, the density of negative charge carriers, i.e., electrons, in the upper part of the substrate 132 is increased. In consequence, a partly conductive channel 138 can be formed between the source region 134 and the drain region 136 in the semiconductor substrate 132. In this situation, a current flowing from the source region 134 to the drain region 136 will mainly depend on the conductivity of the first PN-junction between the source region 134 and the partly conductive channel 138 and the second PN-junction between the partly conductive channel 138 and the drain region 136.

In order to use the memory cell 130 shown in FIG. 1 to store a programming state representative of one or more bits of digital data, electrical charge may be trapped in a left region 148 or a right region 150 of the charge trapping layer 142. If, for example, a negative charge is brought into the left region 148 of the memory cell 140, an electrical field provided by a positive electrical charge brought onto the control gate 146 is shielded in an area close to the left PN-junction at the source region 134. If a negative charge is stored in the right region 150 of the charge trapping layer 142, the electrical field in the area of the right PN-junction close to the drain region 136 is affected. In other words, a first and a second threshold voltage of the memory cell 130 is changed by storing an electrical charge in the left region 148 and the right region 150 of the nitride layer 142, respectively.

The effect of localized charge trapped in the charge trapping layer 142 is used to store two logical values in the memory cell 130. For ease of explanation, they will be referred to as "left bit" and "right bit" in the following. In the embodiment described, only one bit of data is stored in each region 148 and 150.

Further embodiments can also be adapted to store more than one bit of information in each area of a charge trapping or charge storing layer. For example, two bits of information can be stored in each one of the left area 148 and the right area 150. Four different threshold levels may be distinguished by means of different amounts of charge stored in the left and right area 148 and 150. In this case, the memory cell 130 can store up to four bits of data in total.

Programming and reading operations for a so called twin-bit memory cell are described with reference to FIG. 2A. Within the scope of the further description, the term "twin-bit memory cell" is used to refer to a memory cell, in which at least two different threshold values, each threshold level representing a programming state encompassing one or multiple bits of data, are associated with different modes of operation of a memory cell structure. The example described with reference to FIG. 2A includes measuring a forward and a backward current through a partly conductive channel 138 below a nitride layer of an NROM- or SONOS-cell. Other modes of operation may include the provision of different threshold or charge levels to one or more terminals of a memory cell, measuring of threshold currents through or voltages at different locations or terminals of a memory cell, or further means to distinguish multiple threshold levels of a single memory cell structure. Of course, more than two different threshold levels may be distinguished, if the cell features more than two modes of operation, e.g., four different threshold levels measured from left-to-right, right-to-left, front-to-back and back-to-front of a memory cell having four connection terminals arranged on four sides of an essentially planar structure.

FIG. 2A shows a source voltage $V_S$ and a drain voltage $V_D$ applied to the first programming line 160 and the third programming line 164, respectively. The voltages shown in FIG. 2A are provided during three subsequent phases controlled by the control circuit 110.

In a first phase 210, the right bit of a memory cell 130 is programmed by changing an associated first threshold level. In the first phase 210, charge carriers can be injected to the right region 150 of the charge trapping layer 142. In a second phase 212, the first threshold level of the memory cell 130 is detected. In a third phase 214, the first threshold level is altered again, in a way similar to the first phase.

The three phases 210, 212 and 214 shown in FIG. 2A may be operations on the memory cell 130 which are independent from each other. For example, they may represent a first programming operation, followed by a first read operation and a second programming operation.

They can also represent a sequence of operations performed during a more complex operational sequence on the memory cell 130. For example, in the first phase 210, a first programming pulse can be provided to the memory cell 130. Then, in the second phase 212, the effect the first programming pulse had on the memory cell 130 can be verified. For example, a threshold level associated with the right region 150 reached by application of the first programming pulse can be determined in the second phase 212. Then, in the third phase 214, a further programming pulse can be provided to the memory cell 130. The further programming pulse may be provided in order to increase the threshold level associated with the right region 150 of the charge trapping layer 142.

Changing the threshold level associated with the programming state of the right bit may be performed as follows. If charge carriers, e.g., electrons or holes, are to be injected into the right region 150 of the charge trapping layer 142, a first voltage potential is applied between the source region 134 and the drain region 136. FIG. 2A shows that, in the first phase 210, a source voltage of 0 V and a drain voltage of 6 V are applied to the first and third programming lines 160 and 164, respectively. Thus, a voltage potential of 6 V is applied between the first programming line 160 and the third programming line 164 by means of the control circuit 110. At the same time, a second voltage potential is applied between the control gate 146 and the semiconductor substrate 132. For example, a voltage of 9 V may be applied to the control gate 146 by means of the second programming line 162.

Due to the electrical field created in both horizontal and vertical directions, in the embodiment shown in FIG. 1, electrons provided in the source region 134 are accelerated along the partly conductive channel 138 towards the drain region 136. Once the charge carriers accelerated along the partly conductive channel 138 have gained sufficient kinetic energy to jump the electrical barrier posed by the first insulation layer 140, the charge carriers can cross the first insulation layer 140 and become stuck in the charge trapping layer 142. This process is also referred to as hot electron injection. Other methods, such as hot-hole injection or Fowler-Nordheim-tunnelling can also be employed in order to bring positive or negative charge carriers into the right region 150 of the charge trapping layer 142. In general, any physical, chemical or other effect that is apt to change at least one threshold level of a memory cell may be used during programming.

Detecting the threshold level representative of the programming state of the right bit associated with the right region 150 can be performed as follows. A drain voltage $V_D$ is applied to the drain region 136 by the programming line 164. For example, the programming line 164 can be coupled to the electrical ground potential, i.e., 0 V. At the same time, the source region 134 is coupled to a source voltage $V_S$ higher than the drain voltage $V_D$, for example, 2 V. In this way, a voltage potential of 2 V is created between the drain region 136 and the source region 134. Consequently, charge carriers from the drain region 136 are attracted towards the source region 134.

At the same time, a second voltage potential is applied to the control gate 146. For example, a voltage of 3 V may be applied to the control gate 146 by means of the second programming line 162. If no charge carriers are present in the right region 150, the voltage provided to the control gate 146 will attract charge carriers from the semiconductor substrate to partly conductive channel 138. Referring to the embodiment shown in FIG. 1 again, in the area of the PN-junction between the drain region 136 and the semiconductor substrate 132, a relatively high density of charge carriers will be available, making the junction conductive. Consequently, a current will flow from the drain region 136 to the source region 134. If, however, a significant amount of charge is present in the right region 150 of the charge trapping layer 142, the partly conductive channel 138 will be depleted of charge carriers in an area close to the drain region 136. Consequently, no or only a significant smaller current will flow from the drain region 136 to the source region 134 in this case.

A similar effect will occur close to the source region 134. However, even if the partly conductive channel 138 is depleted of charge carriers close to the source region 134, this will have a much lesser effect on a channel current from the drain region 136 to the source region. Electrons are accelerated along their way along the partly conductive channel 138 be the electrical field created between the source region 134 and the drain region 136 and can tunnel to a potential depletion zone close to the source region 134 due to their increased kinetic energy. Though the described effects are specific to the embodiment shown in FIG. 1, similar and other effects will occur in many other types of memory cells. In particular, in memory cells comprising multiple threshold values and/or a threshold value correspond to a programming state encompassing multiple bits of data, some interaction or cross-talk between these threshold levels or bits of data will usually occur, making the presented concept applicable to many other types of memory cells.

According to an embodiment, the control circuit 110 determines the current flowing from the drain region 136 to the source region 134 for a fixed gate voltage $V_G$ in order to determine a first threshold level associated with the amount of charge present in the right region 150 and thus a programming state of the right bit. According to an alternative embodiment, the control circuit 110 varies the gate voltage $V_G$ provided to the control gate 146 and determines the gate voltage $V_G$ required to achieve a fixed reference current IDS from the drain region 136 to the source region 134. According to a further embodiment, the control circuit 110 is adapted to compare a threshold voltage or threshold current of the memory cell 130 with a reference voltage or reference current of a reference cell (not shown) in a known programming state.

Irrespective of the actual method of sensing the programming state of the right bit associated with the right region 150, a current flowing through the partly conductive channel 138 during detection of the first threshold level, i.e., reading of the right bit, is directed in the opposite direction as the channel current used changing the first threshold level, i.e., programming of the right bit. This fact is also indicated by the upper two arrows labeled "program" and "read", respectively, shown in FIG. 1.

Referring again to FIG. 2A, the voltage difference $\Delta V_D$ of the drain voltage $V_D$ between the first phase 210 and the second phase 212 and, also, between the second phase 212 and the third phase 214 is relatively large. For example, the third programming line 164 may be loaded to a voltage of 6 V during the first and the third phase 210 and 214, while it is connected to a ground potential in the intermediate second phase 212. Charging and discharging the programming line 164 requires electrical energy and time. For this reason, in two intermediate phases 216 and 218, no useful operation may be performed on the memory cell 130.

FIG. 2A shows the voltage difference $\Delta V_S$ of the source voltage $V_S$ between the first phase 210 and the second phase 212 and, also, between the second phase 212 and the third phase 214. For example, the voltage difference $\Delta V_S$ may be 2 V between the first phase 210 and the second phase 212. By loading and unloading the first programming line 160, further electrical energy is wasted.

Programming and reading of the left bit of data associated with the left region 148 of the memory cell 130 is performed in essentially the same way as described above. However, in order to modify a second threshold level during programming by bringing charge carriers into the left region 148 of the charge trapping layer 142, a current must flow from the drain region 136 to the source region 134. On the other hand, detecting the second threshold level during reading requires a current to flow from the source region 134 to the drain region 136. That is, programming and reading of the left bit is performed by swapping the electrical potentials provided to the first programming line 160 and the third programming line 164 with respect to the equivalent operation on the right bit. This fact is also indicated by the respective arrows shown in FIG. 1.

FIG. 2B shows a drain voltage $V_D$ and a source voltage $V_S$ provided in an alternative sequence of three phases 220, 222 and 224. In the sequence shown in FIG. 2B, the source voltage $V_S$ is kept at a constant voltage potential. In the example shown in FIG. 2B, the source voltage $V_S$ is kept on a voltage potential of 0V. For example, the first programming line 160 can be connected to the electrical ground potential. The drain voltage $V_D$ provided to the third programming line 164 changes between a first voltage potential and a second voltage potential. For example, during the first and the third phase 220 and 224, respectively, a voltage of 6 V is provided to the third programming line 164. In the second phase 222, a voltage of 2V, can be provided to the third programming line 164.

As can be seen in FIG. 2B, the difference between the first voltage potential and the second voltage potential, denoted as $\Delta V_D$ in FIG. 2B, is smaller than the voltage difference $\Delta V_D$ shown in FIG. 2A. For example, the difference in drain voltage $\Delta V_D$ may be 4 V in the sequence shown in FIG. 2B and 6 V in the sequence shown in FIG. 2A. At the same time, as the source voltage $V_S$ provided to the first programming line 160 is kept at a constant potential, there is no difference in source voltage according to the second sequence, i.e., $\Delta V_S=0V$.

Operating the integrated circuit 100 using the source voltage $V_S$ and the drain voltage $V_D$ as shown in FIG. 2B requires less electrical energy as operating it using the voltage scheme shown in FIG. 2A. With reference to the integrated circuit 100 described above, the sequence of phases 220, 222 and 224 corresponds to changing a first threshold level, for example, during programming operation of the right bit, followed by a determination of a second threshold level, for example, a threshold level associated with the left area 148 in the second phase 222. In the third phase 224, another change of the first threshold level is performed.

FIG. 2C shows a schematic diagram of the threshold levels $V_{TH1}$ and $V_{TH2}$ associated with the right and left bits of the memory cell 130, respectively. The threshold levels $V_{TH1}$ and $V_{TH2}$ shown in FIG. 2C can represent the first threshold voltage of the right area 150 and the left region 148, respectively, during a programming operation of the right bit.

As can be seen in FIG. 2C, during programming of the right bit, i.e., as long as a programming voltage is applied to the programming lines 160 and 164, the first threshold level $V_{TH1}$ increases rapidly. At the same time, the second threshold level $V_{TH2}$ associated with the left bit also increases. However, the rate of increase of the second threshold level $V_{TH2}$ is much smaller than the rate of increase of the first threshold level $V_{TH1}$ during a first time period $T_1$. In this period of time $T_1$, the gap $V_{gap}$ between the first threshold level $V_{TH1}$ and the second threshold level $V_{TH2}$ is widening.

However, if a programming voltage is provided to the programming lines 160 and 164 over a prolonged period of time, the second threshold level $V_{TH2}$ starts following the first threshold level $V_{TH1}$ with essentially the same gradient. This is due, at least in part, to the widening of the right region 150 of the charge trapping layer 142. If too much charge is stored in the right region 150 of the charge trapping layer 142, the right area 150 extends from right to left and eventually merges with the left region 148. Consequently, the second threshold level $V_{TH2}$ associated with the left region 148 is affected by the programming operation, if programming continues after the time $T_1$ has elapsed.

The rate of increase of the first threshold level $V_{TH1}$ may also be reduced beyond a certain point. For example, the left region 150 may become saturated with charge carriers. That is, in a time period $T_2$ shown in FIG. 2C, the gap between the first threshold level $V_{TH1}$ and the second threshold level $V_{TH2}$ remains constant or may be reduced.

Maximizing the gap between the first threshold level $V_{TH1}$ and the second threshold level $V_{TH2}$ aids differentiation and thus detection of the left and right bit, respectively. For this reason, programming of a first bit, for example, the right bit, should be stopped at a point 230 shown in FIG. 2C. At point 230 the second threshold level $V_{TH2}$ essentially starts following the first threshold level $V_{TH1}$. At the same time, a change of gradient or a sharp bend may be detected in the second threshold level $V_{TH2}$ near point 230.

According to one embodiment of the invention, in the first phase 220, a first threshold level $V_{TH1}$ associated with a first programming state of a memory cell 130 is modified. Then, in a second phase 222, a second threshold level $V_{TH2}$ associated with a second programming state is determined. Depending on the level of the detected second threshold level $V_{TH2}$, programming of the first threshold level is continued or ends. That is, according to the embodiment, a sequence of phases as shown in FIG. 2B is used during programming of the right bit of the memory cell 130.

During the first phase 220 and the third phase 224, the first threshold level $V_{TH1}$ associated with the right bit is modified. In the second phase 222, the threshold level associated with the left bit is determined. The programming scheme described with respect to FIG. 2B requires less electrical energy to be provided during programming of the right bit than the scheme described with respect to FIG. 2A. At the same time, programming may be performed faster as the intermediate phases 226 and 228 shown in FIG. 2B are typically shorter.

According to another embodiment, the rate of change of the second threshold level $V_{TH2}$ is determined in the second phase 222. For example, the control circuit 110 can provide a sequence of subsequent programming pulses to modify the first threshold level $V_{TH1}$. In between the provision of subsequent programming pulses, the second threshold level $V_{TH2}$ can be determined. The determined threshold levels $V_{TH2}$ are then compared with one another. If there is a sudden or significant increase between any two subsequent determinations, the programming operation is complete. Other embodiments may also compare the second threshold level $V_{TH2}$ determined during the second phase 222 with a fixed reference threshold value representative of the point 230.

Figure 2D:
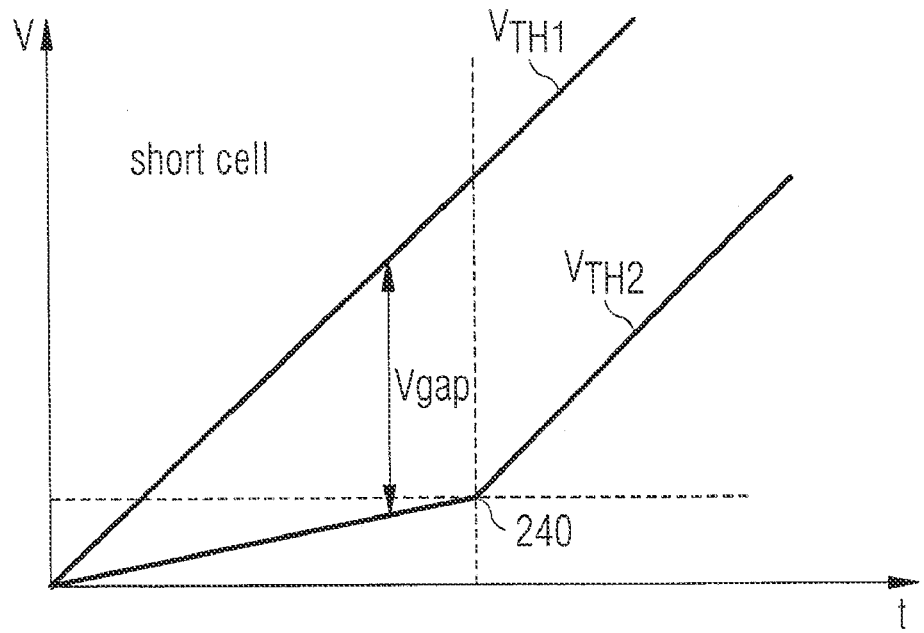
FIG. 2D shows a schematic diagram of a first threshold level and a second threshold level of a second memory cell.

FIG. 2D shows a similar diagram as FIG. 2C. However, a point 240, at which the second threshold level $V_{TH2}$ starts following the first threshold voltage with essentially the same gradient, occurs earlier in FIG. 2D with respect to the situation depicted in FIG. 2C. The threshold voltages $V_{TH1}$ and $V_{TH2}$ shown in FIG. 2D may be representative of a memory cell 130 having a shorter cell length than the memory cell 130 used to obtain the threshold voltages shown in FIG. 2C. In the memory cell 130 shown in FIG. 2D, the difference in threshold voltages $V_{gap}$ remains constant beyond point 240.

Figure 2E:
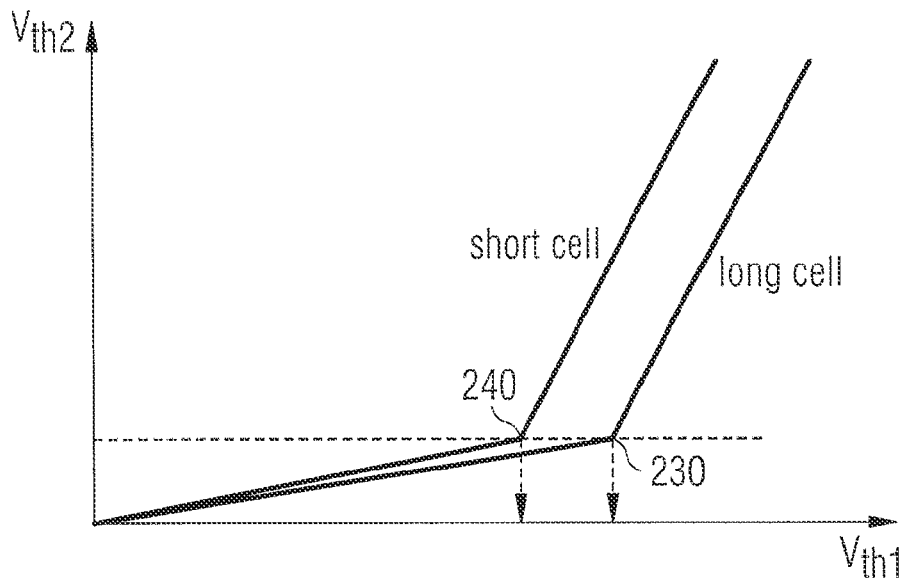
FIG. 2E shows the ratio between the first threshold level and the second threshold level of the first and second memory cells shown in FIGS. 2C and 2D.

FIG. 2E shows a characteristic behavior of the memory cells described with reference to FIGS. 2C and 2D. In FIG. 2E, a threshold level $V_{TH2}$ associated with a charge stored in the left region 148 of a charge trapping layer 142 is shown with respect to a threshold level $V_{TH1}$ of a right region 150 of the charge trapping layer 142. In the example shown in FIG. 2E, the right-hand curve is representative of a memory cell 130 referred to as "long cell", whereas the left-hand curve is representative of a memory cell 130 referred to as "short cell". The terms "long" and "short" here refer to the physical length of partly conductive channel 138 within the semiconductor substrate 132.

As can be seen in FIG. 2E, the behavior of short and long memory cells 130 differs from each other. In particular, in a long memory cell, the second threshold level $V_{TH2}$ starts following the first threshold level $V_{TH1}$ later than the second threshold level $V_{TH2}$ of the short memory cell. However, the characteristic curves of a short memory cell and a long memory cell are similar in that they both expose a characteristic point 230 or 240, in which a sharp bend occurs. Up to that characteristic point 230 and 240, the second threshold level $V_{TH2}$ follows the first threshold level $V_{TH1}$ only slowly. Once this characteristic point 230 or 240, respectively, has been reached, the second threshold level $V_{TH2}$ starts following the first threshold level $V_{TH1}$ more rapidly. As was shown and explained with reference to FIG. 2A to FIG. 2D, the memory cell 130 should be operated at or close to the characteristic point 230 or 240, respectively.

Figure 3:
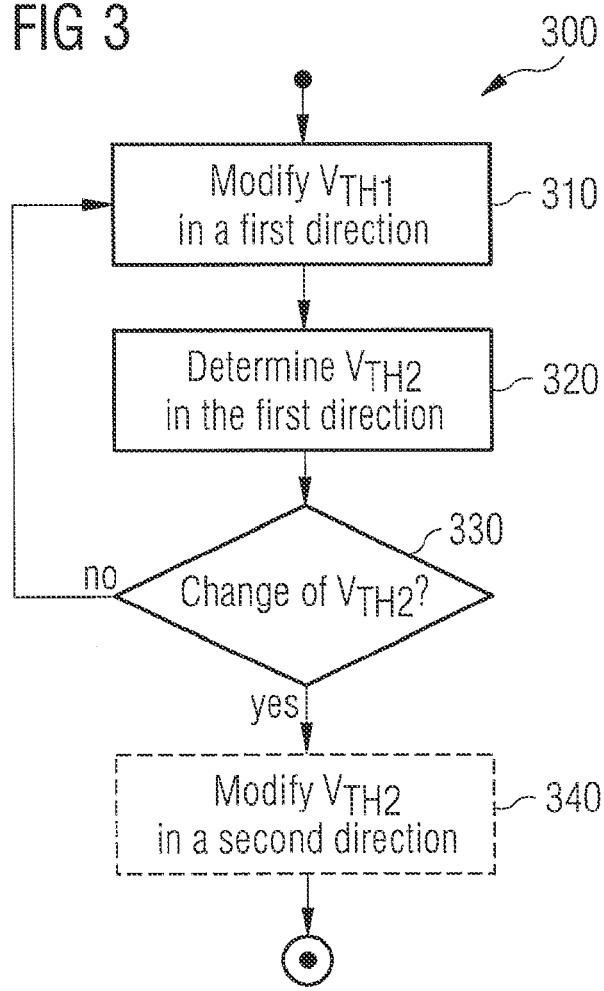
FIG. 3 shows a flow diagram of an embodiment of a first method to operate an integrated circuit.

FIG. 3 shows a flow chart of a method 300 for operating an integrated circuit comprising two threshold levels $V_{TH1}$ and $V_{TH2}$. In particular, FIG. 3 shows method steps 310, 320, 330 and 340 of a programming operation. The method 300 can be used to operate the integrated circuit 100 described above. In addition, the method may also be used in conjunction with the embodiments described with reference to FIGS. 4 and 5 below or with any other integrated circuit comprising a memory capable of storing at least two distinct threshold levels.

According to FIG. 3, the method 300 comprises a step 310, in which a first threshold level $V_{TH1}$ corresponding to a first programming state of a memory cell is modified. The programming state may be associated with a single physical memory cell, like a floating gate memory cell, or a charge-trapping area or charge-storage area within a multi-bit memory cell, such as the right bit of the two-bit memory cell 130 disclosed in FIG. 1 and described above. For the purpose of this example, the right bit associated with the right region 150 of the memory cell 130 shown in FIG. 1 will be used as the first programming state.

In order to modify the first threshold level $V_{TH1}$ representative of the right bit, a channel current is applied to the memory cell 130 in a first direction. For example, a ground potential can be connected to the source region 134 by means of the first bitline 160, while a first electrical potential, for example, 9 V, may be applied to the drain region 136 by means of the third bitline 164. That is, a channel current will flow from the source region 134 to the drain region 136, i.e., from left to right. The direction, amplitude, duration and envelope of the channel current can be controlled by the control circuitry 110.

When the first programming cycle, depicted as step 310 in FIG. 3, has been completed, for example, after a predetermined amount of time or after applying of a predetermined number of programming pulses, the second threshold level $V_{TH2}$ associated with a second programming state is determined in step 320. In the described example, the second threshold level $V_{TH2}$ associated with the left region 148 of the memory cell 130 is determined. Determining of the second threshold level $V_{TH2}$ is performed by applying a channel current to the memory cell 130. The channel current flows from the source region 134 to the drain region 136.

For example, the second threshold level $V_{TH2}$ associated with the left region 148 can be determined by coupling the source region 134 with the electrical ground potential by means of the first programming line 160, and by coupling the drain region 136 by means of the third bitline 164 to an intermediate voltage, e.g., 2 V. At the same time, a voltage potential is provided to the control gate 146 by means of the second programming line 162 by the control circuit 110. For example, a voltage potential of 3 V may be provided to the control gate 146.

Because the memory cell 130, disclosed in FIG. 1, is more sensitive to an electrical charge trapped in the left region 148 close to the source region 134 than to an electrical charge trapped in the right region 150 opposite of the source region 134 in this configuration as described above, the second threshold level $V_{TH2}$ associated with the left bit will be determined in this way.

In one embodiment, the amplitude of the channel current flowing through the partly conductive channel 138 can be detected by the control circuit 110. In another embodiment, the control circuit 110 can compare the channel current through the memory cell 130 with a fixed reference current while the voltage provided to the control gate 146 is ramped up. In this way, a threshold voltage $V_{th}$ at which a predetermined channel current flows through the memory cell 130 can be determined.

In a third step 330, the control circuit 110 detects a change, for example, a shift or discontinuity, of the second threshold level $V_{TH2}$ associated with the second programming state due to the modification of the first threshold level $V_{TH1}$. For example, the second threshold level $V_{TH2}$ associated with the left area 148, determined before and after the provision of a programming pulse to the memory cell 130 in step 310, may be compared with one another.

If the change in the second threshold level $V_{TH2}$ is comparatively minor with respect to its current absolute threshold level or a reference threshold level used to distinguish between different programming states, the method 300 continues with step 310 in which one or more further programming pulses are provided to the memory cell 130 to continue programming the first programming state. This takes account of the fact that the point 230 or 240 identifying the operating point of the memory cell 130 has not been reached yet.

If, in contrast, a major change in the threshold level $V_{TH2}$ is detected in step 330, the programming operation 300 ends. A major change can be a shift that exceeds a predefined threshold value or, alternative, exceed one or more previously observed shifts of the threshold value. If a major shift in the threshold level $V_{TH2}$ is observed in step 330, the point 230 or 240 of optimal or near optimal operation has been reached or has just been passed, such that further programming would not result in a widening of the operating window of the memory cell 130.

It should be noted that the direction of the electrical field or potential applied to the semiconductor substrate 132 and thus the direction of the current flowing through the memory cell 130 stays the same in the sequence comprising steps 310, 320 and 330 comprising modifying the first threshold level $V_{TH1}$ and determining the second threshold level $V_{TH2}$. That is, programming and verifying operations for the first programming state are performed in a first direction, i.e. with a channel current flowing form left to right, whereas programming and verifying operations for the second programming state are performed in a second direction, i.e. right to left. This is due to the fact that the first threshold level associated with the right bit is modified using a channel current flowing in the first direction and detected using a channel current flowing in the second direction. The second threshold level associated with the left bit is modified using a channel current flowing in the second direction and detected using a channel current flowing in the first direction.

As a consequence of the described operating scheme, the first programming line 160 can remain attached to the ground potential throughout the method steps 310 and 320. Thus, no additional charging and discharging of the first programming line 160 takes place during programming of the right bit. The third programming line 164 is charged to a positive voltage potential throughout this period of time. Although its voltage potential differs between the drain voltage $V_D$ used in step 310 for modifying the first threshold level $V_{TH1}$ and the drain voltage $V_D$ used in step 320 for detecting the second threshold level $V_{TH2}$, the voltage difference $\Delta V_D$ is smaller compared with the scheme shown in FIG. 2A, such that charging and discharging the third programming line 164 is also kept to a minimum. The same applies to the second programming line 162, which is also connected to positive voltage levels during both steps 310 and 320.

In conventional methods for programming twin-bit memory cells, the direction of the channel current used during programming and verifying of a programming state is inverted frequently, resulting in a dissipation of energy and a loss of time due to the capacitive and inductive effects of the first and third programming lines 160 and 164. Thus, programming the first programming state in accordance with the presented embodiment improves both the energy efficiency and the speed of programming of the memory cell 130.

Above, the programming of one bit, i.e., the right bit, of a two-bit memory cell 130 has been described. During programming of the second bit, i.e., the left bit, the programming state of the first bit already programmed must be taken into account.

According to the embodiment described with reference to FIG. 3, verification, e.g., determination of a threshold level associated, is omitted during programming of the second bit. This is particularly useful in a symmetrical memory cell 130 as disclosed in FIG. 1. In a symmetrical memory cell 130, the length of the channel 138 in both the first and the second direction of a channel current is identical, resulting in similar characteristics during programming of the right and the left bit.

In an optional step 340, parameters obtained during programming of the right bit can be used during programming of the left bit. During programming of the left bit, a channel current in a second direction, i.e., from the drain region 136 to the source region 134, is provided. Thereafter, the method 300 ends. In the described embodiment, the second threshold level $V_{TH2}$ associated with the left bit is modified without the need for further verification by detecting either the first or second threshold level $V_{TH1}$ or $V_{TH2}$. Consequently, a further saving in energy and operating time can be achieved.

In case the right bit has not been previously programmed, i.e. in cases were the right bit is still in a logical "1" state, such parameters have not been obtained yet. Thus, in another embodiment, parameters obtained by the programming of neighboring memory cells may be used, which are likely to share one or several physical characteristics, e.g., its channel length, of the memory cell 130 to be programmed.

According to another embodiment, the method steps 310 to 320 described above may also be applied during programming of the left bit. That is, during programming of the left bit, comprising modification of the second threshold level $V_{TH2}$, the first threshold level $V_{TH1}$ associated with the right bit is determined and analyzed. Although the absolute value of the first threshold level $V_{TH1}$ of the right bit will be affected by its programming state, its threshold level $V_{TH1}$ will still follow a curve similar to the ones disclosed in FIGS. 2C to 2E, offset by a fixed amount. Consequently an operating point for the programming of the left bit may be determined in a similar fashion as described above with reference to FIG. 3.

Further alternatives, based on characterizing only one or a few memory cells of a representative selection of memory cells are described later with reference to FIGS. 6 and 7. However, such methods may also be employed during normal operations of the integrated circuit 100.

Figure 4:
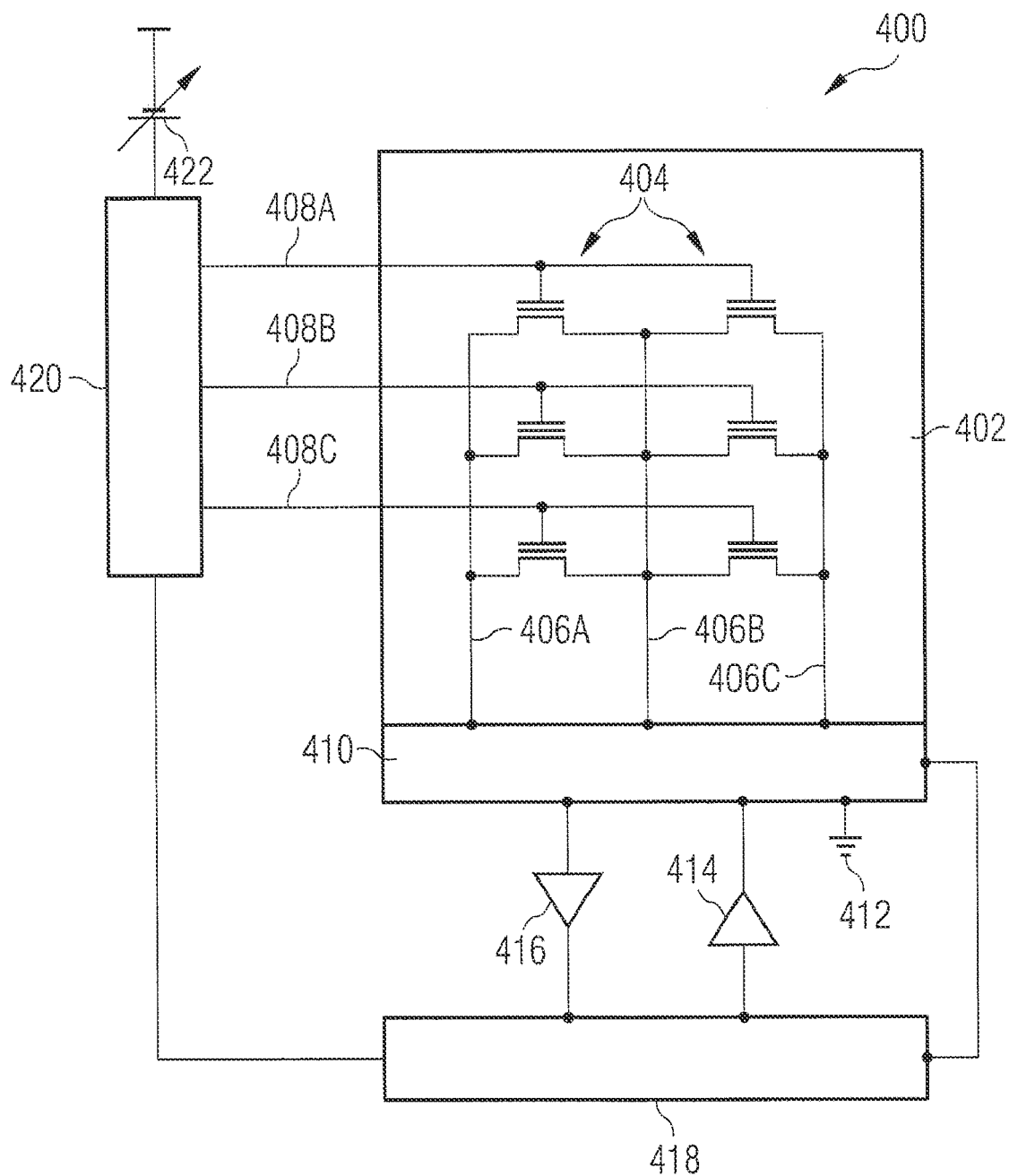
FIG. 4 shows an integrated circuit comprising an array of memory cells according to another embodiment.

FIG. 4 shows a schematic diagram of an integrated circuit 400 comprising an array 402 of memory cells 404 according to another embodiment. The array 402 shown in FIG. 4 comprises three rows and three columns. However, other arrays can comprise hundreds, thousands or tens of thousands of rows and columns or more.

In the embodiment shown in FIG. 4, the memory cells 404 can include non-volatile EEPROM floating gate memory cells, SONOS-cells, FRAM-, MRAM- or other types of memory cells having at least one threshold level. The memory cells 404 are arranged in a so-called NOR architecture, in which each memory cell 404 is connected to two neighboring bitlines 406 (406A, 406B, 406C), a left bitline and a right bitline, respectively. Multiple memory cells 404 in the same column of the array 402 are connected to the same left and right bitlines 406. In addition, memory cells 404 arranged in the same row of the array 402 are connected to a common wordline 408 (408A, 408B, 408C). In order to better distinguish the bitlines 406 and wordlines 408 of the array 402, they are identified by suffixes A, B and C attached to the reference numerals 406 and 408, respectively.

In addition to the rows and columns shown in FIG. 4, other means of structuring an array 400 can be used. In another embodiment an array comprises a plurality of erase blocks. Each erase block comprises a plurality of memory cells, which can be addressed individually for reading and programming, but which are erased collectively.

Each of the bitlines 406 may be connected to an electrical ground potential 412, a programming circuit 414, or a read amplifier 416, respectively. For this purpose, one or more of the bitlines 406 may be selected by means of selection circuitry 410. The selection circuitry 410 can be controlled by control circuitry 418 based on a target address of a memory cell 404 to be programmed. The wordlines 408 can be selected and connected to an adjustable voltage supply 422 by means of a wordline selection circuit 420. The operations of the wordline selection circuit 420, the read amplifier 416 and the programming circuit 414 may also be controlled by the control circuitry 418.

In contrast to the previous embodiment, the memory cells 404 shown in FIG. 4 can not hold multiple threshold levels. Instead, each memory cell 404 of the array 402 is associated with a single threshold level. The threshold level may be representative of a one or plurality of logical values. For example, if four different threshold levels can be distinguished, two bits of binary data can be stored in any one memory cell 404.

However, due to the common electrical connections formed by the wordlines 408 and bitlines 406, memory cells 404 arranged in a common column or common row are not electrically independent of each other. In particular, providing a programming pulse to the memory cell 404 arranged in the first row and the first column of the array 402 may also affect the threshold level of the memory cells 404 arranged in the same column or row of the array 402, because they are connected to the same wordline 408A or bitlines 406A and 406B, respectively.

Consequently, monitoring a second threshold level $V_{TH2}$ associated with a second memory cell 404 can be used to detect and limit a negative influence of the programming operation on neighboring or otherwise electrically or spatially related first memory cells 404. For example, during modification of a first threshold level $V_{TH1}$ of the memory cell 404 arranged in the first column and the first row of the array 402, a second threshold level $V_{TH2}$ of the memory cell 404 arranged in the second column and first row of the array 402 can be observed. Hence, the method 300 for programming a memory cell described above with reference to the twin-bit memory cell 130 of integrated circuit 100 can also be applied during programming of the memory cells 404 comprising in the integrated circuit 400 comprising only a single threshold level each.

According to another embodiment, an integrated circuit comprises an array of memory cells. Each memory cell comprises a plurality of localized charge-trapping or charge-storage areas, each one associated with a separate threshold level. One example of such a structure is a so called NAND-type memory, in which a plurality of floating gates and corresponding control gates are embedded in a common semiconductor structure for storing multiple bits of data.

Figure 5:
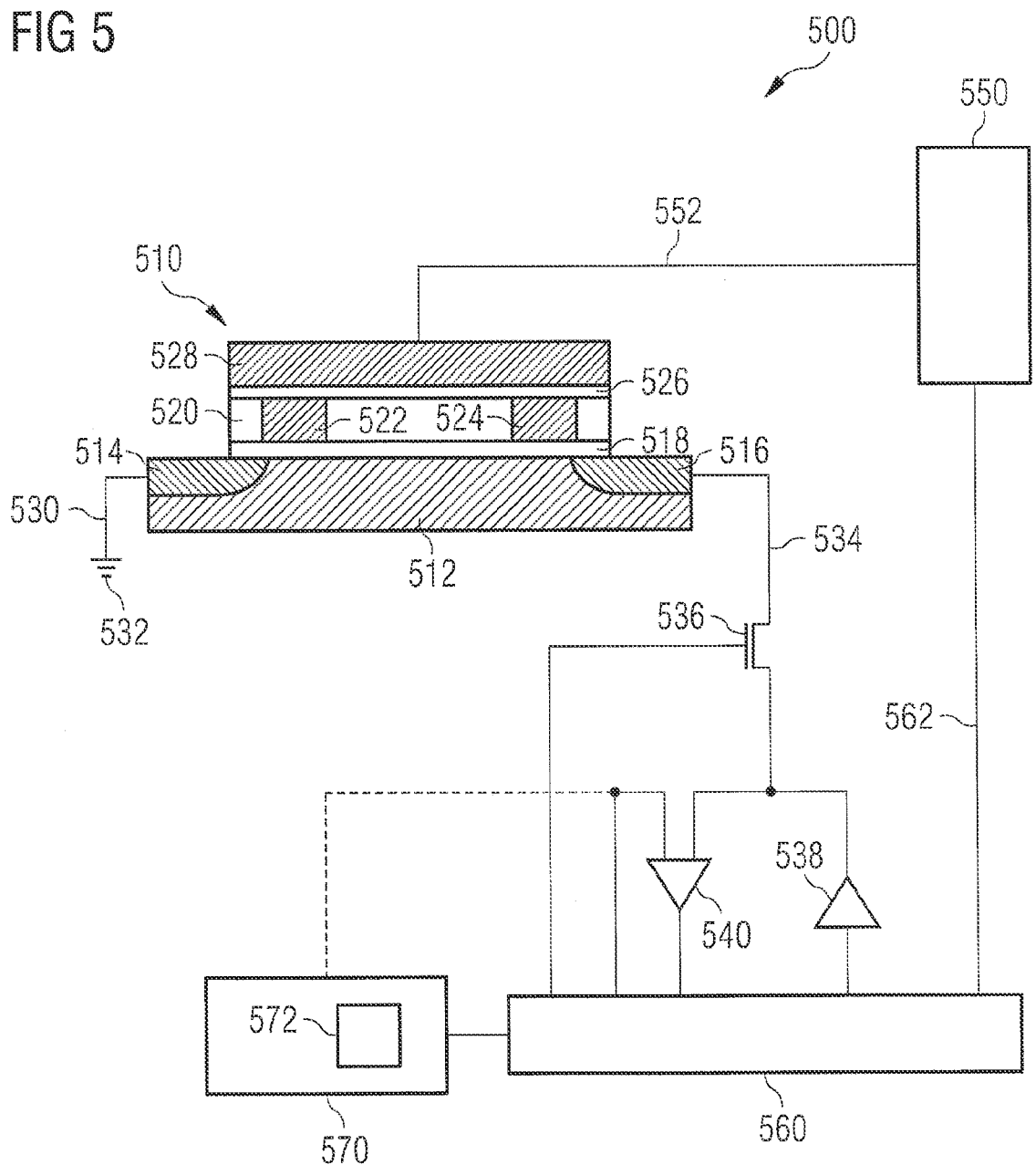
FIG. 5 shows an integrated circuit comprising a memory cell according to another embodiment.

FIG. 5 shows a schematic diagram of another integrated circuit 500 comprising a memory cell 510 according to another embodiment. The embodiment shown comprises only a single memory cell 510. In practice, however, a plurality of memory cells 510 may be comprised in the integrated circuit 500.

The memory cell 510 according to FIG. 5 is a non-volatile memory cell. It comprises a modified metal oxide substrate field electric transistor (MOSFET) structure. In particular, it comprises a substrate 512, made of a semiconductor material, for example, a P-type silicon substrate, embedded in which are two terminal regions, a source region 514 and a drain region 516. Both the source region 514 and the drain region 516 are doped using an adequate dopant, for example, using an N+-type dopant. Corresponding PN-junctions are formed in the substrate 512, one close to each terminal region of the memory cell 510.

Above the substrate 512, an insulation layer 518 is formed. Above the first insulation layer 518, two separate conductive charge-storing areas 522 and 524 are provided in a charge-storage layer 520 close to the source region 514 and the drain region 516, respectively. In particular, the memory cell 510 may comprise two or more buried polysilicon islands acting as left and right charge-storage areas 522 and 524. Above the charge-storage layer 520 a second insulation layer 526 and a conductive control gate 528 is formed. The control gate 528 can comprise a polycrystalline material or doped polysilicon, for example.

The structure described above can also be used to store two programming states, also referred to as bits of information in the following. Each programming state can be in either an erased state or a programmed state, sometimes also referred to as "high" or "1" state and "low" or "0" state, respectively. In the arrangement shown in FIG. 5, a left bit is stored using a threshold level associated with the left charge-storage region 522 close to the source region 514 and a right bit is stored using a threshold level associated with the right charge-storage region 524 close to the drain region 516.

Further referring to FIG. 5, the control gate 528 is connected to a wordline 552. The source region 514 and the drain region 516 are connected to a first bitline 530 and a second bitline 534, respectively. In the embodiment shown, the first bitline 530 is connected to a ground potential 532. The second bitline 534 is connected to a programming circuit 538 and a read amplifier 540 by means of a selection transistor 536.

In another embodiment (not shown in the drawings), the first bitline 530 or the second bitline 534 can be selectively connected to the ground potential 532, the read amplifier 540 or the programming circuit 538. In addition, a plurality of selection transistors 536 can be provided to connect one of a plurality of bitlines to one or more read amplifiers 540 or programming circuits 538. The simplifications shown in FIG. 1 are made for ease of representation and comprehension, but are not meant to limit the scope of the present disclosure.

Referring to FIG. 5 again, both, the programming circuit 538 and the read amplifier 540, are connected to control circuitry 560. The control circuitry 560 may comprise a control network consisting of hardware alone, or a combination of hardware and software. For example, it may comprise a programmable micro-controller adapted to execute a computer program comprising program instructions for operating the integrated circuit 500.

In addition, the integrated circuit 500 comprises a wordline selection circuit 550 also connected to the control circuitry 560. The arrangement further includes an operating memory 570 with a register 572. In the embodiment shown in FIG. 5, the operating memory 570 is connected with both the control circuitry 560 and the read amplifier 540.

In alternative embodiments similar to the ones shown in FIGS. 1, 4 and 5, each corresponding integrated circuit include one or multiple multi-level cells (MLC). In a multi-level cell, each storage location stores two or more bits of data. For example, in the integrated circuit shown in FIG. 5, two bits are stored in each one of a left charge-storage region 522 and a right charge-storage region 524. In general, each storage location of a multi-level cell is adapted to store a threshold level representative of one of at least four programming states, for example, corresponding to programming states "00", "01", "10" and "11". Distinguishing between four (or even more) threshold levels narrows a range of permissible threshold levels corresponding to each individual programming state, such that effects caused by the programming of neighboring charge-storage regions or memory cells are of particular interest. Monitoring the threshold level of one memory cell or charge-storage region while programming a neighboring memory cell or charge-storage region, respectively, is therefore of particular advantage in the operation of multi-level cells in general.

Figure 6:
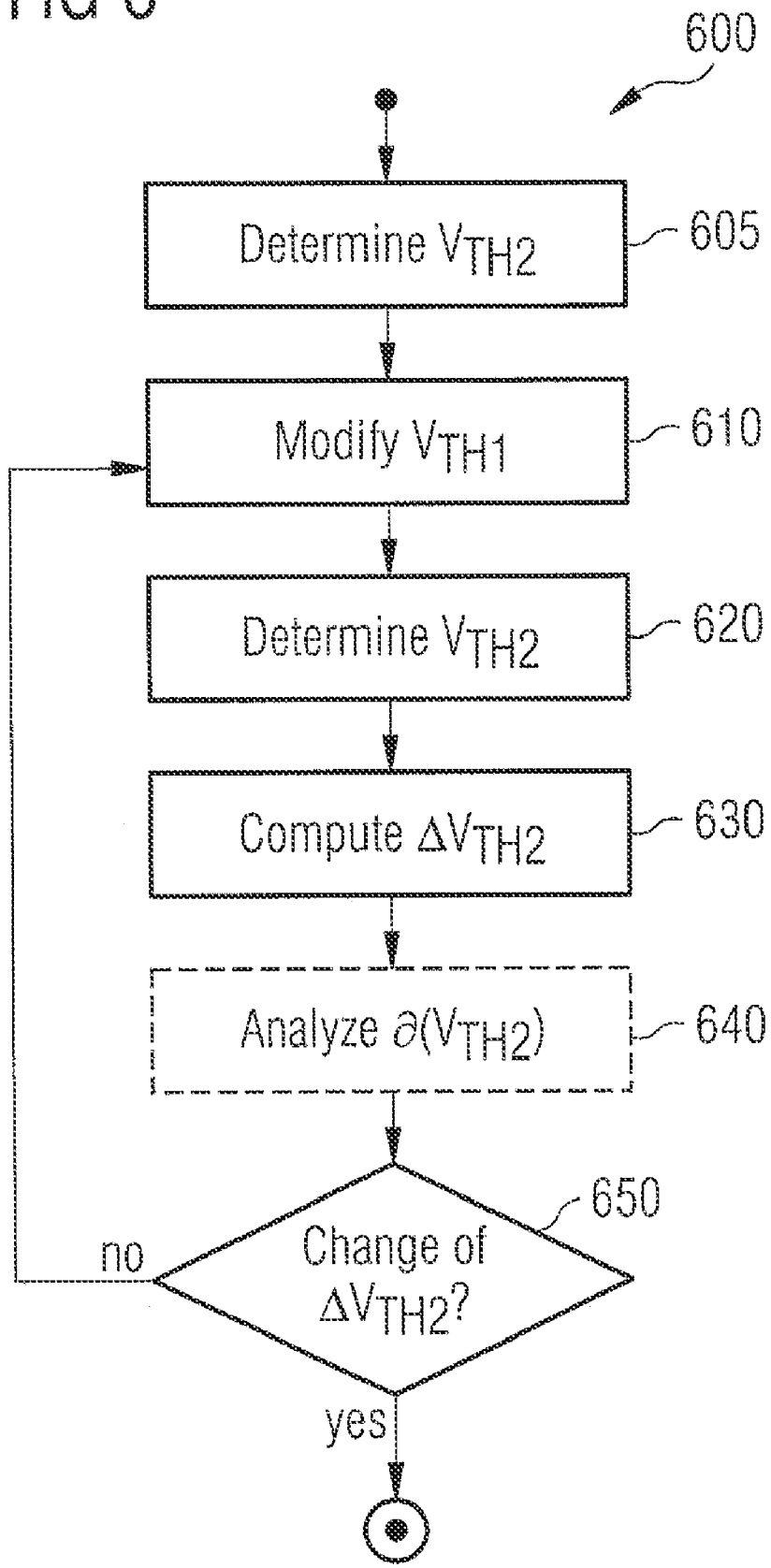
FIG. 6 shows a flow chart of an embodiment of a method to operate an integrated circuit.

FIG. 6 shows a flow chart of an embodiment of a method 600 for operating the integrated circuit 500. In the following, the operation of the integrated circuit 500 during the programming of a right bit associated with the charge-storage area 524 will be described in further detail. Similar method steps can be used to program the left bit associated with the left charge-storage area 522 or with any other embodiment described within this application.

In a first step 605, an initial value of a second threshold level $V_{TH2}$ associated with a second programming state, in the example presented in FIG. 6 the left bit associated with the left charge-storing area 522, is determined. The threshold level $V_{TH2}$ associated with the left bit can be determined by connecting the drain region 516 by means of the second bitline 534 and the selection transistor 536 with the read amplifier 540 to an intermediate voltage, e.g., 2 V. At the same time, a voltage potential is provided to the control gate 528 by means of the wordline 552 and the wordline selection circuit 550. For example, a voltage potential of 3 V may be provided to the control gate 528.

The memory cell 510, disclosed in FIG. 5, is more sensitive to a programming state of a charge-storage area 522 closer to the source region 514 connected to electrical ground 532 than to a programming state of the charge-storage area 524 close to the drain region 516, if a channel current flows from the source region to the drain region, i.e., from left to right. In consequence, the second threshold level $V_{TH2}$ may be determined in this configuration by means of the read amplifier 540. For example, a current flowing through the memory cell 510 may be detected by the read amplifier 540. Alternatively, the read amplifier 540 may compare a current through the memory cell 510 with a fixed reference current while the voltage provided to the control gate 528 is ramped up. In this way, the voltage $V_{th}$ at which a predetermined channel current $I_{th}$ flows through the memory cell 510 may be determined.

In a step 610, a first threshold level $V_{TH1}$ corresponding to a programming state of the right bit of the memory cell 510 is modified. In order to program the right bit associated with the right charge-storage area 524, one or a plurality of programming pulses can be applied to the memory cell 510. In step 610, a first electrical potential, for example, 9 V, is applied to the drain region 516 by means of the second bitline 534, the selection transistor 536 and the programming circuit 538. The amplitude, duration and shape of the one or more programming pulses can be controlled by the control circuitry 560. At the same time, the memory cell 510 is selected by means of the word selection circuit 550 and the wordline 552 connected to the control gate 528 of the memory cell 510. For example, a programming voltage of 10 V may be applied to the control gate 528.

When the first programming cycle, depicted as step 610 in FIG. 6, has been completed, for example, after a predetermined amount of time or provision of a predetermined number of programming pulses, the second threshold level $V_{TH2}$ associated with the left bit is determined in step 620. Determination of the second threshold level $V_{TH2}$ can be performed as described above with reference to step 605.

In a further step 630, the difference in threshold level $\Delta V_{TH2}$ between the second threshold level $V_{TH2}$ determined in step 620 and the second threshold level $V_{TH2}$ determined in step 605 is computed. For example, a threshold level $V_{TH2}$ identified by the read amplifier 540 during a first execution of step 620 may be stored in the register 572 of the operating memory 570. Then, after providing additional programming pulses to the memory cell 510, the step 620 is performed again. The threshold level $V_{TH2}$ determined during the second execution of the step 620 is detected by the read amplifier 540 and compared with the value stored in the register 572.

In a further, optional step 640, the change in gradient $\partial$ of the difference in threshold levels $\Delta V_{TH2}$ is analyzed. For example, by storing the difference $\Delta V_{TH2}$ between a first and a second determined threshold level $V_{TH2}$ in a second register (not shown) and comparing it with the difference $\Delta V_{TH2}$ between a second and a third measurement of the second threshold level $V_{TH2}$, a change in the gradient $\partial$ of the curve can be determined. A sharp bend in the curve representing the second threshold level $V_{TH2}$ of the memory cell 510 during a programming operation can be identified in this way.

In a step 650, the control circuitry 560 detects a change, for example, a shift or discontinuity, of the second threshold level $V_{TH2}$ associated with the second programming state due to the modification of the first threshold level $V_{TH1}$. According to the embodiment shown in FIG. 6, the rate of change $\Delta V_{TH2}$ of the threshold level is compared with a reference level. For example, the rate of change of the threshold level $\Delta V_{TH2}$ after the provision of a first and second programming pulse, respectively, may be compared.

If the difference between the individual rates of change $\Delta V_{TH2}$ is comparatively minor, the method 600 continues with step 610, in which one or more further programming pulses are provided to the memory cell 510. Otherwise, the programming operation 600 ends.

As explained above, during changing the first threshold and detecting the second threshold, a current through the memory cell 510 flows in the same direction, i.e., from the source region 514 to the drain region 516. Consequently, the first bitline 514 can remain attached to the ground potential 532 throughout the entire method 600.

The method of operating the memory cell 510 disclosed in and explained with reference to FIG. 6 allows detecting a near optimal point of operation during programming itself. However, as disclosed with reference to FIG. 7 below, the point of operation may also be detected during grading or initialization of an integrated circuit.

FIG. 7 shows a method 700 for determining an operation point of an integrated circuit comprising a memory. It will be described with reference to the integrated circuit shown in FIG. 4. However, it may also be used in connection with the integrated circuits 100 or 500, shown in FIG. 1 or 5 respectively. The method 700 can also be applied to many other types of circuitry comprising at least two distinct threshold levels.

The method 700 may be performed during initialization, for example, during grading or starting of the integrated circuit 400. That is, method 700 may be executed once only, i.e., as part of a manufacturing process, or on a regular basis, for example, whenever the integrated circuit 400 is connected to a host system or connected to a power supply.

In a step 710, a counter C is initialized. For example, a fixed value of 0 or 1 may be stored in the counter C. Counter C may be stored in a further register (not shown) of the working memory 570.

In a step 720, a memory cell, for example, the memory cell 404, can be subjected to one or a plurality of programming pulses for modifying a first threshold level $V_{TH1}$. Programming may be performed in a way similar to one of the embodiments described above or, in accordance with any other method for programming a memory cell 404.

In a step 730, a second threshold level $V_{TH2}$ associated with a second programming state is determined. For example, the threshold voltage of a neighboring memory cell 404 may be determined. In another embodiment, a threshold current $I_{th}$ instead of the threshold voltage $V_{th}$ is determined.

In a step 740, a shift of the threshold level $V_{TH2}$ is detected. For example, a shift of the threshold voltage or threshold current may be detected as described with reference to FIGS. 3 and 6 above.

If no significant shift in the second threshold level $V_{TH2}$ is detected in step 740, the counter C is increased in a subsequent step 750. Thereafter, the method continues with step 720 by providing further programming pulses to the memory cell 404 for further modifying the first threshold level $V_{TH1}$.

If, instead, a significant shift in the second threshold level $V_{TH2}$ is detected in step 740, the present value of the counter C is stored in a step 760. For example, the counter value C may be stored in a further register (not shown) of the operating memory 570 or in a memory cell 404 of the array 402 designated for system use.

Once the counter value C is determined and stored, the method 700 for determining an operation point ends. The stored counter value C represents the number of programming pulses that can be used to alter the first threshold level $V_{TH1}$ representative of a first programming state before the second threshold level $V_{TH2}$ representative of a second programming state is affected in a negative way.

Instead of storing the counter value itself, any other parameter suitable to determine an optimal or near-optimal operating window may be stored, for example, a parameter indicative of an integrated overall charge or current provided during programming of the first programming state.

Method 700 may be applied to each memory cell 404 of an array 402 during grading. Alternatively, an operating point for only a selection of memory cells 404 may be determined. In particular, the method 700 may be executed only once or a few times for each array 402, erase block, column, row, memory page or any other structure determined by the configuration of the integrated circuit 400. In addition, or alternatively, statistical methods such as averaging, sampling, interpolating or extrapolating may be applied to measurements taken and parameters determined in order to estimate optimal or at least improved operating parameters for an integrated circuit.

Although FIGS. 3, 6 and 7, showing flow charts of methods 300, 600 and 700, respectively, indicate a particular order of individual method steps, many of the method steps may be performed in an order different from the one described above without departing from the teaching disclosed therein. Equally, some of the method steps may be performed in parallel in order to speed up execution. Thus, while the method steps were described in a particular order, any other order that achieves a similar goal performing similar steps shall be covered by the present application as determined by the following patent claims.

Equally, all features disclosed with reference to any one embodiment may also be used in combination with any other embodiment disclosed herein, either alone or in combination with any other feature.

Different embodiments of integrated circuits can comprise individual memory cells, large arrays of memory cells alone or complex circuitry with embedded memories of a larger system chip. In general, one or several memory cells described herein may be formed in an integrated circuit according to techniques otherwise known in the art. Such an integrated circuit can, for example, include additional logic circuitry, processors, ASICs and so on.

Furthermore, although the embodiments described above referred to widely used NROM and floating gate EEPROM memories, any other known or future type of volatile or non-volatile memory such as multi-level cells (MLC), static RAM (SRAM), dynamic RAM (DRAM), Ferro-electric RAM (FRAM, FeRAM), Magneto-resistive RAM (MRAM), Phase Change Memory (PCM), Phase Change RAM (PCRAM), Chalcogenide RAM (C-RAM), Ovonic Unified Memory (OUM), Programmable Metallization Cell (PMC), Organic RAM (ORAM), Conductive Bridge RAM (CBRAM), Nanotube RAM (NRAM) may be used in conjunction with the novel concepts as described herein.

What is claimed is:

1. A method of operating an integrated circuit comprising a memory, the memory comprising:
a first threshold level representative of a first programming state and a second threshold level representative of a second programming state, the method comprising:

starting a programming operation for the first programming state, thereby affecting the second threshold level;

monitoring the second threshold level; and determining an end of the programming operation for the first programming state based on the monitoring of the second threshold level.

2. The method of claim 1, wherein the programming operation comprises:

modifying the first threshold level, thereby affecting the second threshold level; and determining the second threshold level;

wherein the end of the programming operation is determined if a predefined amount of change of the second threshold level is reached or exceeded.

3. The method of claim 2, wherein modifying the first threshold level and determining the second threshold level are performed repeatedly, the method further comprising:

determining a difference of the second threshold level determined in subsequent repetitions.

4. The method of claim 3, wherein the end of the programming operation is determined if the determined difference exceeds a predetermined threshold value.

5. The method of claim 3, wherein the end of the programming operation is determined if the determined difference exceeds a previously determined difference.

* * * * *